United States Patent
Lin et al.

(10) Patent No.: US 10,840,932 B2
(45) Date of Patent: Nov. 17, 2020

(54) ANALOG-TO-DIGITAL CONVERTER

(71) Applicant: MEDIATEK INC., Hsinchu (TW)

(72) Inventors: Ying-Zu Lin, Hsinchu (TW); Chin-Yu Lin, Hsinchu (TW); Chih-Hou Tsai, Hsinchu (TW); Shan-Chih Tsou, Hsinchu (TW); Chao-Hsin Lu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/539,050

(22) Filed: Aug. 13, 2019

(65) Prior Publication Data
US 2020/0119744 A1  Apr. 16, 2020

Related U.S. Application Data

(60) Provisional application No. 62/744,705, filed on Oct. 12, 2018.

(51) Int. Cl.
*H03M 1/08* (2006.01)
(52) U.S. Cl.
CPC .................. *H03M 1/0854* (2013.01)
(58) Field of Classification Search
CPC .................................... H03M 1/0854
USPC .................................. 341/118–165
See application file for complete search history.

(56) References Cited

U.S. PATENT DOCUMENTS 9,197,240 B1 * 11/2015 Kinyua ............... H03M 1/002
9,425,818 B1 * 8/2016 Rajaee ................ H03M 3/32

9,698,805 B1 * 7/2017 Bandyopadhyay ............
                                              H03M 1/0626
9,774,345 B1 * 9/2017 Yoshioka ............ H03M 1/466
10,003,348 B2   6/2018 Liu
10,110,242 B2 * 10/2018 Liu ..................... H03M 1/1215
10,171,097 B1 * 1/2019 Lin ..................... H03M 1/0863
10,608,655 B1 * 3/2020 Li ........................ H03M 1/1057
2012/0169520 A1 * 7/2012 Furuta ................... H03M 1/164
                                                341/110

(Continued)

FOREIGN PATENT DOCUMENTS

TW  201820791 A  6/2018
WO  2017/195911 A1  11/2017

OTHER PUBLICATIONS

Lin, Y.Z., et al.; "A 2.4-mW 25-MHz BW 300-Ms/s Passive Noise Shaping SAR ADC with Noise Quantizer Technique in 14-nm CMOS;" 2017 Symposium on VLSI Circuits Digest of Technical Papers; Jun. 2016; pp. 1-2.

(Continued)

*Primary Examiner* — Lam T Mai
(74) *Attorney, Agent, or Firm* — McClure, Qualey & Rodack, LLP.

(57) ABSTRACT

A noise-shaping successive approximation analog-to-digital converter (NS-SAR ADC) using a passive noise-shaping technique with 1-input-pair SAR comparator is introduced. A residue sampling and integration circuit is coupled between a DAC and the comparator, for sampling a residue voltage generated by the DAC and charge-sharing of the sampled residue voltage. A first integral capacitor is coupled between a first input terminal of a comparator and a first output terminal of a DAC. After a first residue capacitor samples a residue generated by the DAC, the first residue capacitor is coupled to the first integral capacitor for charge-sharing of the residue voltage.

20 Claims, 7 Drawing Sheets

(56) References Cited

U.S. PATENT DOCUMENTS

| | | | | |
|---|---|---|---|---|
| 2013/0106629 | A1* | 5/2013 | Nys | H03M 1/144 |
| | | | | 341/110 |
| 2016/0352351 | A1* | 12/2016 | Miki | H03M 1/0626 |
| 2017/0085349 | A1* | 3/2017 | Ho | H04L 5/0041 |
| 2017/0126239 | A1* | 5/2017 | Sun | H03M 3/398 |
| 2017/0317683 | A1* | 11/2017 | Bandyopadhyay | H03M 3/426 |
| 2018/0083647 | A1* | 3/2018 | Yoshioka | H03M 1/462 |
| 2019/0097648 | A1* | 3/2019 | Sim | H03M 3/464 |
| 2019/0190531 | A1* | 6/2019 | Martens | H03M 1/462 |
| 2019/0207620 | A1* | 7/2019 | Lee | H03M 1/468 |
| 2019/0280707 | A1* | 9/2019 | Hiraide | H03M 1/10 |
| 2019/0373197 | A1* | 12/2019 | Harada | A61B 1/045 |

OTHER PUBLICATIONS

Lin, Y.Z., et al.; "A 40MHz-BW 320MS/s Passive Noise-Shaping SAR ADC with Passive Signal-Residue Summation in 14nm FinFET;" ISSCC 2019/Session 20/ Noise-Shaped & VCO-Based ADCs; Feb. 2019; pp. 1-3.

Fredenburg, J.A., et al.; "A 90-MS/s 11-MHz-Bandwidth 62-dB SNDR Noise-Shaping SAR ADC;" IEEE Journal of Solid-State Circuits; vol. 47; No. 12; Dec. 2012; pp. 2898-2904.

Chen, Z., et al.; "A 9.35-ENOB, 14.8 fJ/conv.-step Fully-Passive Noise-Shaping SAR ADC;" 2015 Symposium on VLSI Circuits Digest of Technical Papers; 2015; pp. 1-2.

Session 18 of 2017 Symposium on VLSI Circuits Digest of Technical Papers; 2017; pp. 1-9.

Fredenburg, J.A.; "Noise-Shaping SAR ADCs;" Dissertation for University of Michigan; Dec. 2015; pp. 1-158.

Ghaedrahmati, H., et al.; "160 MS/s 20 MHz bandwidth third-order noise shaping SAR ADC;" Electronics Letters; vol. 54; No. 3; Feb. 2018; pp. 128-130.

Lin, Y.Z., et al.; "A 2.4-mW 25-MHz BW 300-MSs passive noise shaping SAR ADC with Noise Quantizer Technique in 14-nm CMOS;" 2017 Symposium on VLSI Circuits Digest of Technical Papers; Jun. 2017; pp. 1-2.

Shi, L., et al.; "A 13b-ENOB Noise Shaping SAR ADC with a Two-Capacitor DAC;" IEEE; Aug. 2018; pp. 153-156.

Park, H., et al.; "A 13-bit noise shaping SAR-ADC with dual-polarity digital;" Analog Integr Circ Sign Process; Feb. 2013; pp. 459-465.

Yoshio, S.S., et al.; "A rail-to-rail noise-shaping non-binary SAR ADC;" IEEE; Dec. 2016; pp. 1-4.

* cited by examiner

ANALOG-TO-DIGITAL CONVERTER

CROSS REFERENCE TO RELATED APPLICATIONS

This application claims the benefit of U.S. Provisional Application No. 62/744,705, filed on Oct. 12, 2018, the entirety of which is incorporated by reference herein.

BACKGROUND OF THE INVENTION

Field of the Invention

The present invention relates to analog-to-digital converters (ADCs).

Description of the Related Art

SAR ADCs (successive approximation analog-to-digital converters) are popular in mobile WiFi applications due to their low power and small area. An SNR (signal-to-noise ratio) of 60-70 dB is necessary to meet the noise budget for the downlink chain in the 802.11ac/ax standards. Comparator noise and quantization noise are typically the dominant noise sources limiting the SNR. Recently, noise-shaping SAR (NS-SAR) ADCs have become popular to increase SNR, which considerably reduce these two noise sources.

A basic concept of SAR ADC is described in this paragraph. During an input sampling phase, an input voltage $V_I$ is sampled onto a weighted capacitor array (capacitive digital-to-analog converter, abbreviated to CDAC). During an analog-to-digital conversion phase, a successive approximation scheme is performed. The CDAC is controlled by digital signals for successive approximation that is performed based on the sampled input voltage $V_I$. A comparator operates according to the CDAC to change the digital signals controlling the CDAC. According to a series of comparator outputs, the capacitors within the CDAC are switched between several reference voltages to equalize the voltage levels at the positive and negative output terminals of the CDAC, and the digital representation of the input voltage $V_I$ is determined from the MSB (most significant bit) to the LSB (least significant bit). A residue voltage $V_R$ may still exist between the positive and negative output terminal of the CDAC after the successive approximation. A noise-shaping signal may be derived from the residue voltage $V_R$ for noise elimination. The comparator of the SAR ADC (SAR comparator) usually provides an additional differential input pair for subtraction of the noise-shaping signal. The additional differential input pair, however, may contribute extra thermal and kickback noise.

Furthermore, the generation of the noise-shaping signal may involve a charge-sharing procedure. An active residue amplification (using an op amp) is usually used to maintain the residue amplitude, which consumes a lot of power. As for a passive solution (without the op amp), a gain ratio between the signal and residue input pairs of the SAR comparator is required, which results in a large-sized SAR comparator. Specifically, for a higher order noise shaping, the charge-sharing procedure may repeat and the SAR comparator may require more input pairs. In conventional techniques, extra timing slots are required for the charge-sharing procedure, which also limits the sampling rate of the NS-SAR ADC.

An efficient, low power and small area NS-SAR ADC is called for.

BRIEF SUMMARY OF THE INVENTION

A noise-shaping successive approximation analog-to-digital converter (NS-SAR ADC) using a passive noise-shaping technique with 1-input-pair SAR comparator is introduced.

An analog-to-digital converter (ADC) in accordance with an exemplary embodiment of the present invention includes a digital-to-analog converter (DAC), a comparator, and a residue sampling and integration circuit. The DAC samples an input signal according to a first control signal. The comparator operates according to the DAC to change the first control signal controlling the DAC, and for generating digital representation of the input signal. The residue sampling and integration circuit is coupled between the DAC and the comparator, for sampling a residue voltage generated by the DAC and charge-sharing of the sampled residue voltage.

In an exemplary embodiment, the residue sampling and integration circuit includes a first integral capacitor and a first residue capacitor. The first integral capacitor is coupled between a first input terminal of the comparator and a first output terminal of the DAC. After the first residue capacitor samples a residue voltage generated by the DAC, the first residue capacitor is coupled to the first integral capacitor for charge-sharing of the residue voltage.

In an exemplary embodiment, the residue sampling and integration circuit further includes a second integral capacitor and a second residue capacitor. The second integral capacitor is coupled between a second input terminal of the comparator and a second output terminal of the DAC. After the second residue capacitor samples a value of the residue voltage, the second residue capacitor is coupled to the second integral capacitor for charge-sharing of the residue voltage.

In an exemplary embodiment, when sampling the residue voltage, a top plate of the first residue capacitor is coupled to the first output terminal of the DAC and a bottom plate of the first residue capacitor is coupled to the second output terminal of the DAC. When sampling the value of the residue voltage, a top plate of the second residue capacitor is coupled to the second output terminal of the DAC and a bottom plate of the second residue capacitor is coupled to the first output terminal of the DAC.

In an exemplary embodiment, a top plate of the first integral capacitor is coupled to the first input terminal of the comparator and a bottom plate of the first integral capacitor is coupled to the first output terminal of the DAC. A top plate of the second integral capacitor is coupled to the second input terminal of the comparator and a bottom plate of the second integral capacitor is coupled to the second output terminal of the DAC.

In an exemplary embodiment, when the first residue capacitor is coupled to the first integral capacitor for charge-sharing of the residue voltage, the top plate of the first residue capacitor is coupled to the top plate of the first integral capacitor and the bottom plate of the first residue capacitor is coupled to the bottom plate of the first integral capacitor. When the second residue capacitor is coupled to the second integral capacitor for charge-sharing of the residue voltage, the top plate of the second residue capacitor is coupled to the top plate of the second integral capacitor and the bottom plate of the second residue capacitor is coupled to the bottom plate of the second integral capacitor.

In an exemplary embodiment, a first input sampling phase, a first analog-to-digital conversion phase, and a first residue sampling phase are arranged. During the first input sampling phase, the DAC samples the input voltage. During the first analog-to-digital conversion phase, the successive approximation is performed. During the first residue sampling phase, the first residue capacitor samples the residue voltage and the second residue capacitor samples the value of the residue voltage. The first residue sampling phase overlaps the first input sampling phase and the first analog-to-digital conversion phase without using additional timing slots.

In an exemplary embodiment, a second input sampling phase, a second analog-to-digital conversion phase, and a first residue integral phase are additionally arranged. During the second input sampling phase following the first analog-to-digital conversion phase, the DAC samples the input voltage again. During the second analog-to-digital conversion phase following the second input sampling phase, the successive approximation is performed again. During the first residue integral phase, the first residue capacitor is coupled to the first integral capacitor and the second residue capacitor is coupled to the second integral capacitor for charge-sharing of the residue voltage. The first residue integral phase overlaps the second input sampling phase and the second analog-to-digital conversion phase without using additional timing slots.

In an exemplary embodiment, the residue sampling and integration circuit further includes a third residue capacitor and a fourth residue capacitor, for Ping-Pong mode operations.

In an exemplary embodiment, the DAC operates at a stable common-mode voltage.

In an exemplary embodiment, the DAC operates at a changing common-mode voltage for single-side successive approximation.

In an exemplary embodiment, the ADC further includes an amplifier. The amplifier has input terminals coupled to the first output terminal and the second output terminal of the DAC, and has output terminals coupled to the first integral capacitor and the second integral capacitor.

In an exemplary embodiment, the first residue capacitor is formed by two capacitors connected in series with a connection terminal coupled to a direct current voltage, and the second residue capacitor is formed by two capacitors connected in series with a connection terminal coupled to the direct current voltage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
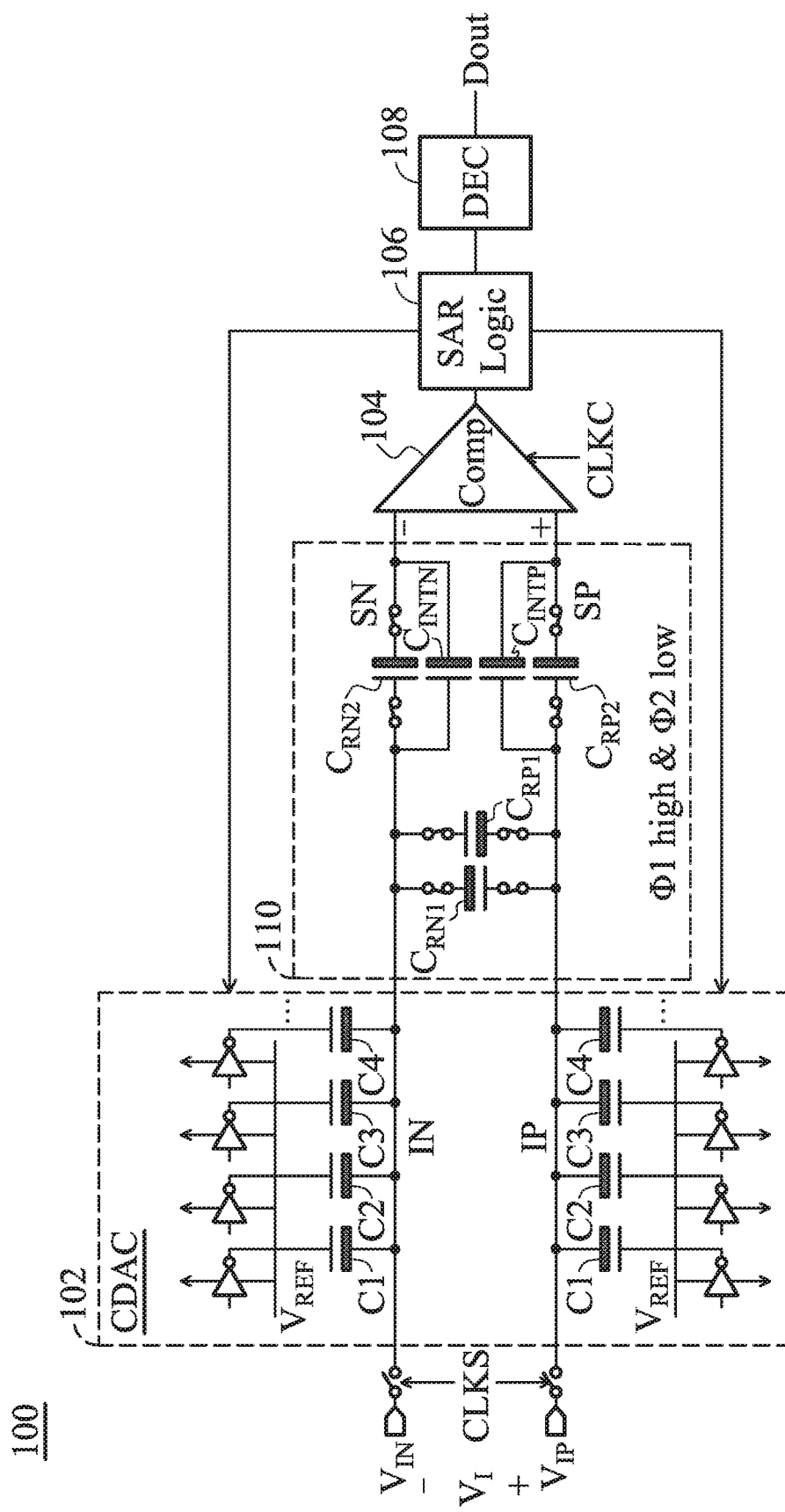
FIG. 1 depicts a NS-SAR ADC (noise-shaping successive approximation analog-to-digital converter) 100 in accordance with an exemplary embodiment of the present invention.

FIG. 1 depicts a NS-SAR ADC (noise-shaping successive approximation analog-to-digital converter) 100 in accordance with an exemplary embodiment of the present invention.

The NS-SAR ADC 100 includes a CDAC (capacitive digital-to-analog converter) 102, a comparator (as known as a SAR comparator) 104, a SAR logic unit 106 and a decoder 108. The CDAC 102 is a weighted capacitor array. During an input sampling phase (corresponding to a high status of the control signal CLKS), an input voltage $V_I$ (=$V_{IP}$–$V_{IN}$) is sampled onto the weighted capacitor array (CDAC 102). The top plates (corresponding to terminals IP and IN) of the CDAC 102 are coupled to the comparator 104. During an analog-to-digital conversion phase (corresponding to a series of pulses of the control signal CLKC), a series of comparator outputs are generated and sent to the SAR logic unit 106. Accordingly, the SAR logic unit 106 switches the reference voltages coupled to the capacitors of the CDAC 102 to achieve the successive approximation between the two terminals IP and IN. The successive approximation controlled by the SAR logic unit 106 is decoded by the decoder 108. A digital representation Dout of the input voltage $V_I$ (=$V_{IP}$–$V_{IN}$) is generated.

The NS-SAR ADC 100 includes a residue sampling and integration circuit 110. The residue sampling and integration circuit 110 includes a residue capacitor pair ($C_{RP1}$, $C_{RN1}$), a residue capacitor pair ($C_{RP2}$, $C_{RN2}$) and an integral capacitor pair ($C_{INTP}$ and $C_{INTN}$). A residue voltage ($V_R$) between the two terminals IP and IN is sampled selectively by the residue capacitor pair ($C_{RP1}$, $C_{RN1}$) or the residue capacitor pair ($C_{RP2}$, $C_{RN2}$), and is integrated into the integral capacitor pair ($C_{INTP}$ and $C_{INTN}$) by charge sharing. The integral capacitor $C_{INTP}$ is configured between the terminal IP and positive input terminal '+' (or SP) of the comparator 104 with the top plate coupled to the positive input terminal '+' and the bottom plate coupled to the terminal IP. Another integral capacitor $C_{INTN}$ is configured between the terminal IN and negative input terminal '−' (or SN) of the comparator 104 with the top plate coupled to the negative input terminal '−' and the bottom plate coupled to the terminal IN. The residue capacitor pairs ($C_{RP1}$, $C_{RN1}$) and ($C_{RP2}$, $C_{RN2}$) are utilized in a Ping-Pong mode, switched according to control signals Φ1 and Φ2.

In FIG. 1, the control signal Φ1 is high and the control signal Φ2 is low. The residue capacitors $C_{RP1}$ and $C_{RN1}$ are coupled in parallel between the terminals IP and IN in a reverse direction with respect to each other. The residue capacitor $C_{RP1}$ samples the residue voltage $V_R$ and the capacitor $C_{RN1}$ samples the negative value of the residue voltage $V_R$. The top plate and the bottom plate of the residue capacitor $C_{RP1}$ are coupled to the terminals IP and IN, respectively. The top plate and the bottom plate of the capacitor $C_{RN1}$ are coupled to the terminals IN and IP, respectively. As for the residue capacitor pair ($C_{RP2}$, $C_{RN2}$), the previous residue voltage sampled in the residue capacitor $C_{RP2}$ and the negative value of the previous residue voltage sampled in the capacitor $C_{RN2}$. As shown, and the residue capacitors $C_{RP2}$ and $C_{RN2}$ are coupled to the integral capacitors $C_{INTP}$ and $C_{INTN}$ for residue integral. The top plate and the bottom plate of the residue capacitor $C_{RP2}$ are coupled to the top plate and the bottom plate of the integral capacitor $C_{INTP}$, respectively. The top plate and the bottom plate of the capacitor $C_{RN2}$ are coupled to the top plate and the bottom plate of the integral capacitor $C_{INTN}$, respectively.

Specifically, the comparator 104 includes one input pair. The integral of the residue voltage is added to the voltages at the terminals IP and IN. Instead of arranging additional input pair in the comparator 104, the noise-shaping signal is directly compensated on the voltages retrieved from the terminals IP and IN. The comparator 104 does not require additional input pair for the subtraction of noise-shaping signal.

Figure 2:
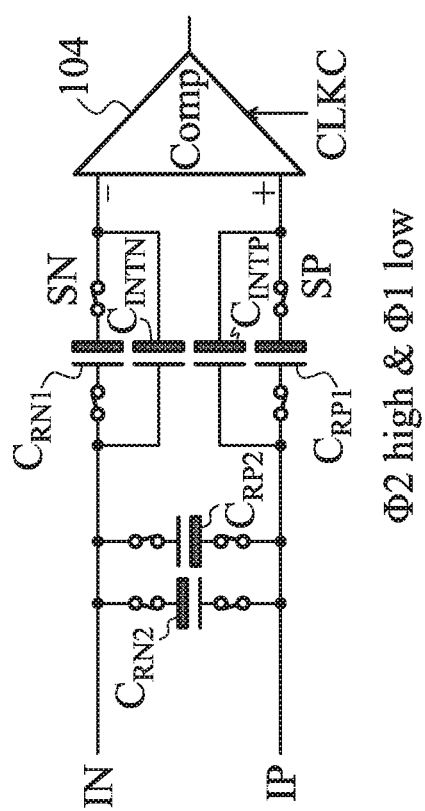
FIG. 2 shows the connection of the residue capacitor pairs ($C_{RP1}$, $C_{RN1}$) and ($C_{RP2}$, $C_{RN2}$) when the control signal Φ2 is high and the control signal Φ1 is low.

FIG. 2 shows the connection of the residue capacitor pairs ($C_{RP1}$, $C_{RN1}$) and ($C_{RP2}$, $C_{RN2}$) when the control signal Φ2 is high and the control signal Φ1 is low. The residue capacitors $C_{RP2}$ and $C_{RN2}$ are coupled in parallel between the terminals IP and IN in a reverse direction with respect to each other. The residue capacitor $C_{RP2}$ samples the residue voltage $V_R$ and the capacitor $C_{RN2}$ samples the negative value of the residue voltage $V_R$. The top plate and the bottom plate of the residue capacitor $C_{RP2}$ are coupled to the terminals IP and IN, respectively. The top plate and the bottom plate of the capacitor $C_{RN2}$ are coupled to the terminals IN and IP, respectively. This time, and the residue capacitors $C_{RP1}$ and $C_{RN1}$ are coupled to the integral capacitors $C_{INTP}$ and $C_{INTN}$ for residue integral. The top plate and the bottom plate of the residue capacitor $C_{RP1}$ are coupled to the top plate and the bottom plate of the integral capacitor $C_{INTP}$, respectively. The top plate and the bottom plate of the capacitor $C_{RN1}$ are coupled to the top plate and the bottom plate of the integral capacitor $C_{INTN}$, respectively.

FIG. 1 and FIG. 2 show Ping-Pong switching of the residue capacitor pairs ($C_{RP1}$, $C_{RN1}$) and ($C_{RP2}$, $C_{RN2}$).

Figure 3:
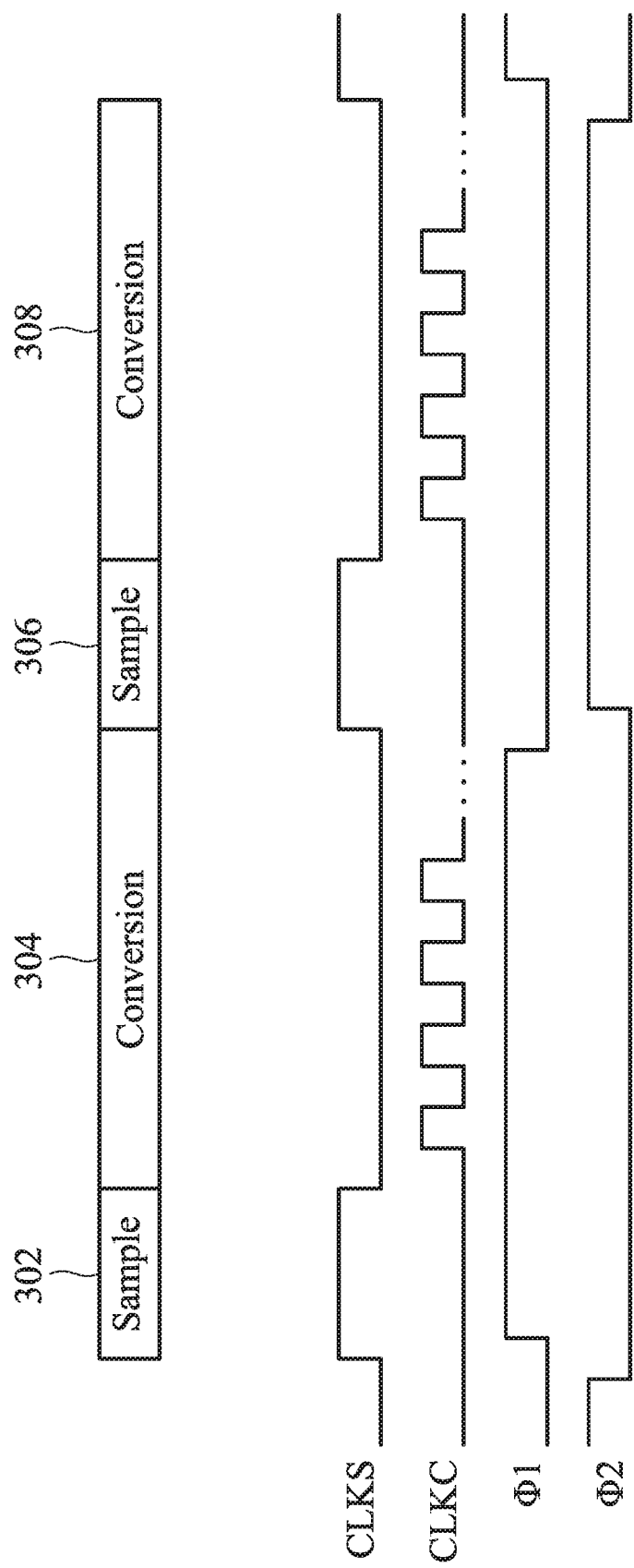
FIG. 3 is a timing diagram of the control signals CLKS, CLKC, Φ1 and Φ2.

FIG. 3 is a timing diagram of the control signals CLKS, CLKC, Φ1 and Φ2. When the control signal CLKS is high, the input sampling phase for the input voltage $V_I$ is performed. Following the input sampling phase is the analog-to-digital conversion phase. As shown, the control signal CLKC oscillates during the analog-to-digital conversion phase. Without using any additional timing slots, the noise-shaping compensation including residue sampling and residue integral is performed during the input sampling phase and the analog-to-digital conversion phase. The sampling rate is improved.

In FIG. 3, there is a first input sampling phase 302, a first analog-to-digital conversion phase 304, a second input sampling phase 306 and a second analog-to-digital conversion phase 308. When the control signal Φ1 is high and the control signal Φ2 is low, a residue sampling phase is implemented by the residue capacitor pair ($C_{RP1}$, $C_{RN1}$) and a residue integral phase is implemented by the residue capacitor pair ($C_{RP2}$, $C_{RN2}$), the two phases overlapping the first input sampling phase 302 and the first analog-to-digital conversion phase 304. When the control signal Φ1 is low and the control signal Φ2 is high, a residue integral phase is implemented by the residue capacitor pair ($C_{RP1}$, $C_{RN1}$) and a residue sampling phase is implemented by the residue capacitor pair ($C_{RP2}$, $C_{RN2}$), the two phases overlapping the second input sampling phase 306 and the second analog-to-digital conversion phase 308. No additional timing slots are required for the residue sampling and residue integral.

In the exemplary embodiment of FIG. 3, the control signal Φ1 is asserted after the control signal CLKS is asserted and prior to the oscillating of the control signal CLKC. The control signal Φ1 is de-asserted before the next asserting of the control signal CLKC. The control signal Φ2 is asserted after the asserting for the input sampling phase 306 and prior to the oscillating of the control signal CLKC, and is de-asserted before the next asserting of the control signal CLKC.

Figure 4:
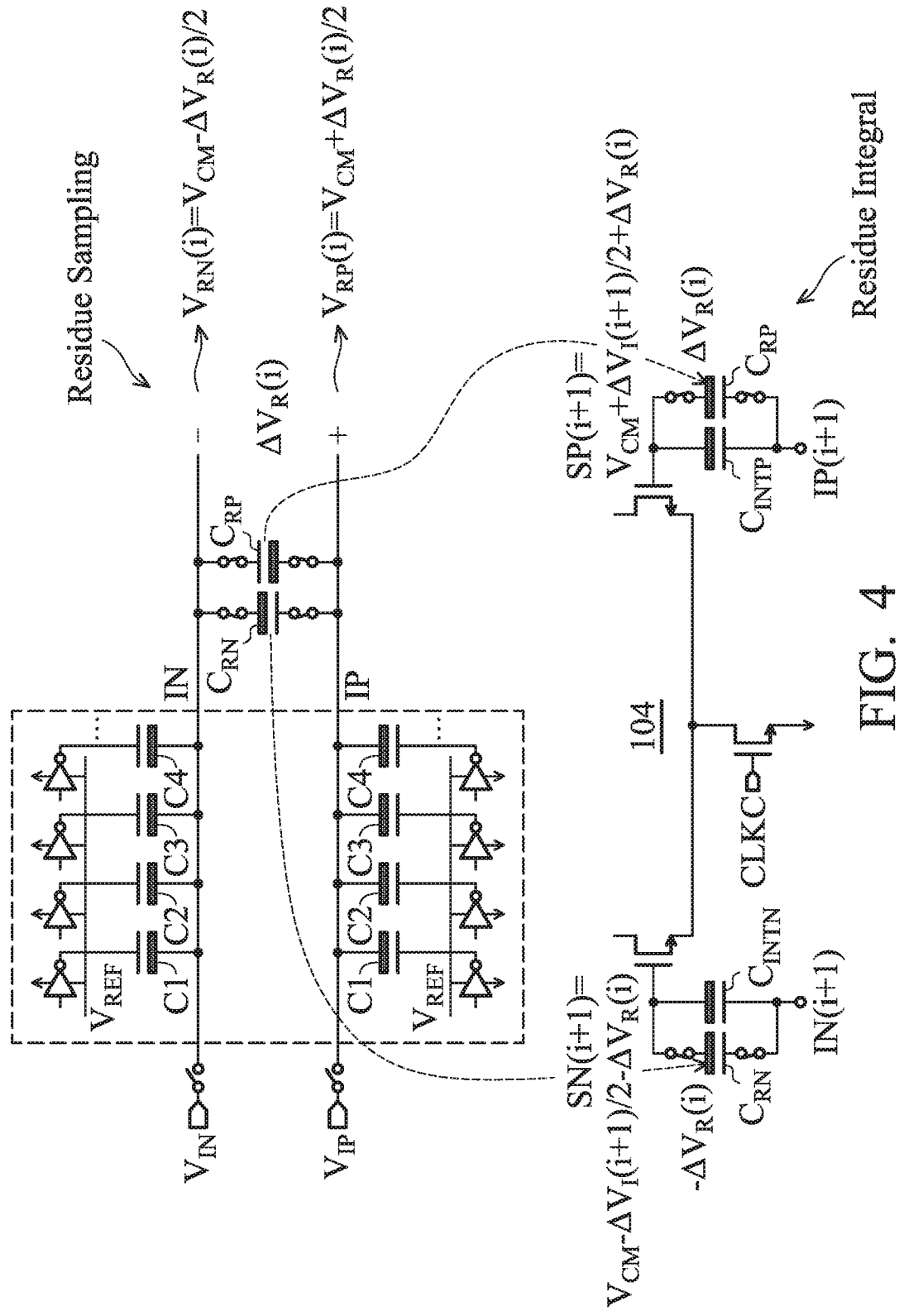
FIG. 4 details the signals at the different circuit terminals.

FIG. 4 details the signals at the different circuit terminals. At terminal IP, the residue component $V_{RP}(i)$ is $V_{CM}+\Delta V_R(i)/2$. At terminal IN, the residue component $V_{RN}(i)$ is $V_{CM}-\Delta V_R(i)/2$. By setting the control signal (Φ1/Φ2), the residue capacitor pair ($C_{RP}$, $C_{RN}$) is switched between residue sampling and residue integral.

Through the residue sampling, the residue voltage $\Delta V_R(i)$ is captured by the residue capacitor pair ($C_{RP}$, $C_{RN}$). The residue capacitors $C_{RP}$ and $C_{RN}$ are connected in parallel between the terminals IP and IN in opposite directions. The residue capacitor $C_{RP}$ samples a positive value of the residue voltage $\Delta V_R(i)$ while the capacitor $C_{RN}$ samples a negative value of the residue voltage $\Delta V_R(i)$.

When switching the residue capacitor pair ($C_{RP}$, $C_{RN}$) for residue integral, the residue capacitors $C_{RP}$ and $C_{RN}$ are connected to the positive and negative input terminals of the comparator 104, respectively. The sampled residue voltage $\Delta V_R(i)$ is added to the positive input of the comparator 104, and subtracted from the negative input of the comparator 104.

Specifically, the output pair IP(i+1) and IN(i+1) of the CDAC 102 is also coupled to the same input pair SP(i+1) and SN(i+1) of the comparator 104 through the integral capacitor pairs ($C_{INTP}$ and $C_{INTN}$) and residue capacitor pairs ($C_{RP}$, $C_{RN}$). As shown, the voltage level at the positive and negative input terminals of the comparator 104 are:

$$SP(i+1)=V_{CM}+\Delta V_I(i+1)/2+\Delta V_R(i)$$

$$SN(i+1)=V_{CM}-\Delta V_I(i+1)/2-\Delta V_R(i)$$

The residue voltage $\Delta V_R(i)$ is doubled without using any operational amplifier. And there is no need to use an additional comparator input pair with larger transistor size for the amplification of the residue voltage $\Delta V_R(i)$.

Figure 5:
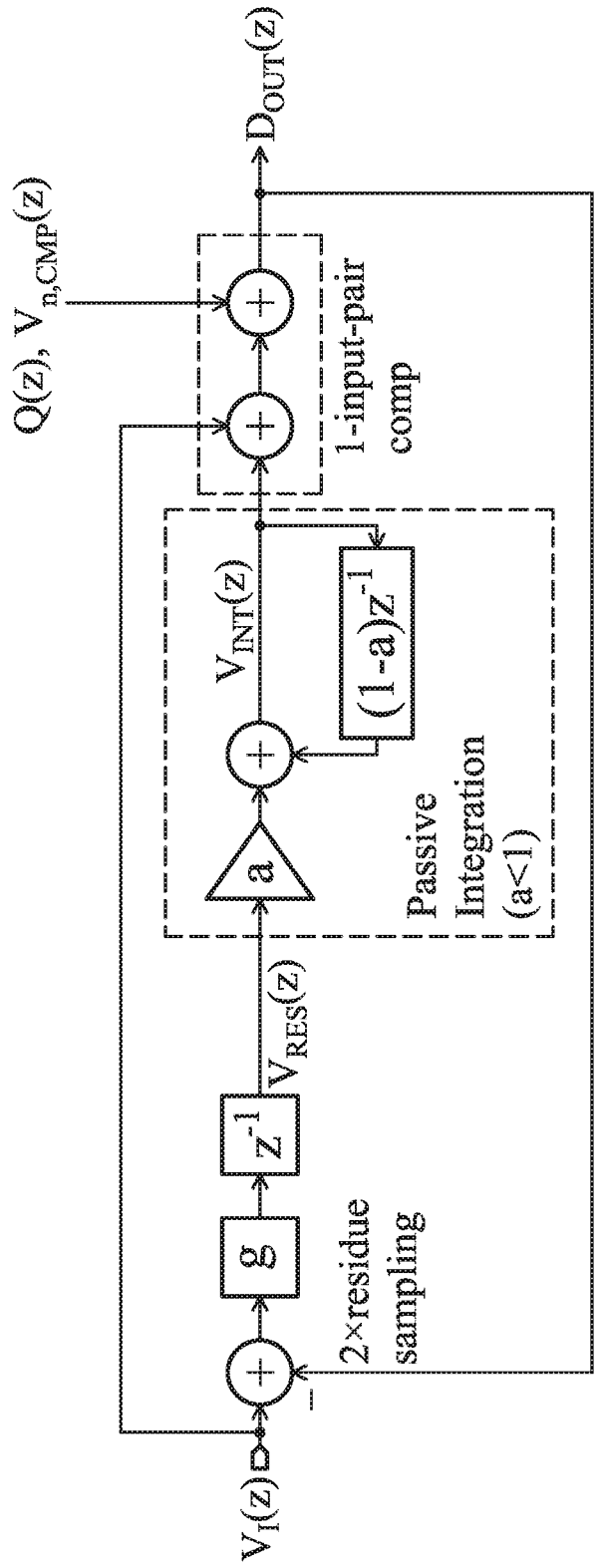
FIG. 5 is a block diagram depicting the transfer function of the NS-SAR ADC 100.

FIG. 5 is a block diagram depicting the transfer function of the NS-SAR ADC 100. The passive integration (capacitor sharing between $C_{RES}$ and $C_{INT}$) makes the factor a smaller than 1, where a is $C_{RES}/(C_{RES}+C_{INT})$. Specifically, the sampled residue voltage is amplified without op amplifier or additional large-sized comparator input pair. When a is 0.5 and g is 2, the transfer function of the NS-SAR ADC 100 is:

$$D_{OUT}(z)=V_I(z)+[(1-0.5Z^{-1})/(1+0.5Z^{-1})](Q(z)+V_{n,CMP}(z))$$

The quantization error $Q(z)$ and comparator error $V_{n,CMP}(z)$ are effectively suppressed.

Figures 6A, 6B:
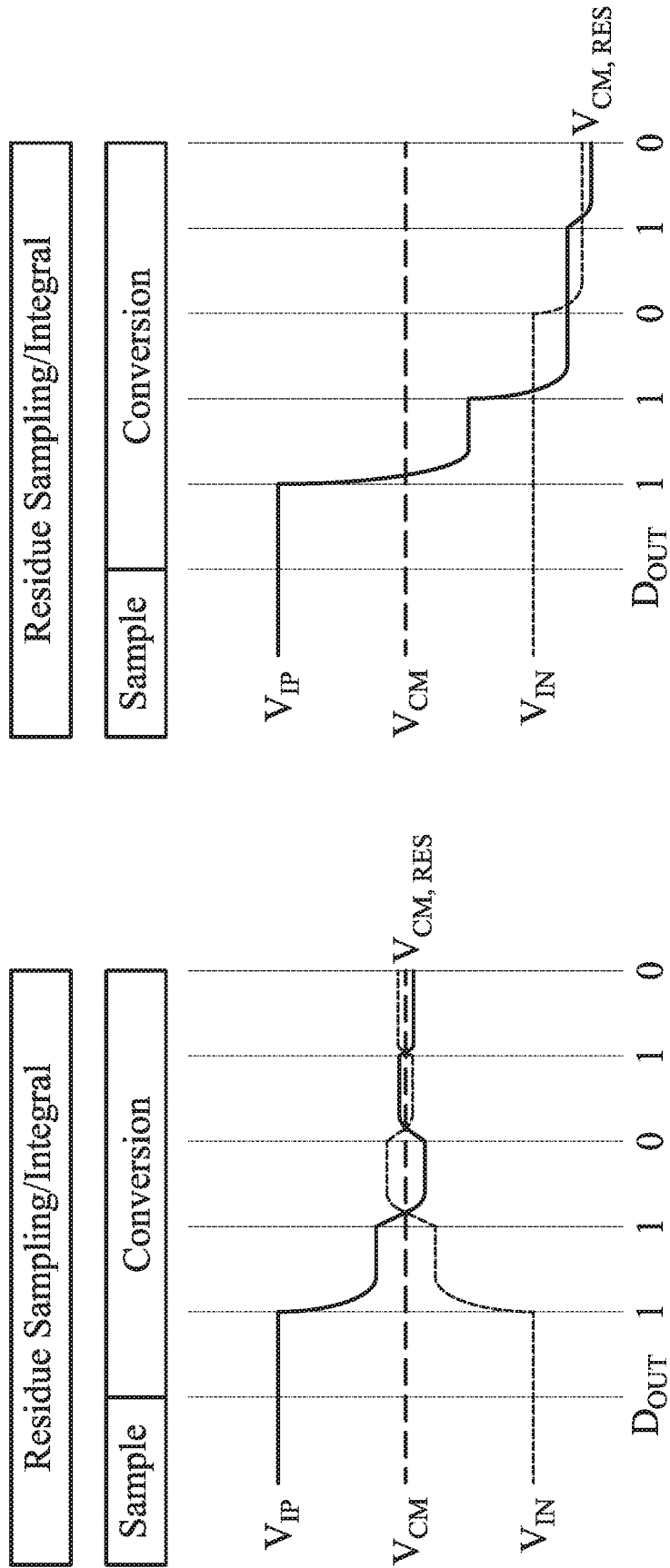
FIG. 6A shows successive approximation based on a stable common-mode voltage VCM and FIG. 6B shows successive approximation based on a changing common-mode voltage $V_{CM}$.

The NS-SAR ADC 100 compensates for the noise according to the sampled residue voltage. Specifically, the residue voltage is sampled without the component of the common-mode voltage VCM. Thus, the NS-SAR ADC 100 is not only compatible with the successive approximation based on a stable common-mode voltage VCM as shown in (FIG. 6A), but also works well for successive approximation based on the changing common-mode voltage VCM (FIG. 6B).

In an exemplary embodiment, the CDAC 102 operates at a stable common mode voltage $V_{CM}$. In another exemplary embodiment, the CDAC 102 operates at a changing common mode voltage $V_{CM}$ for single-side successive approximation.

Figure 7:
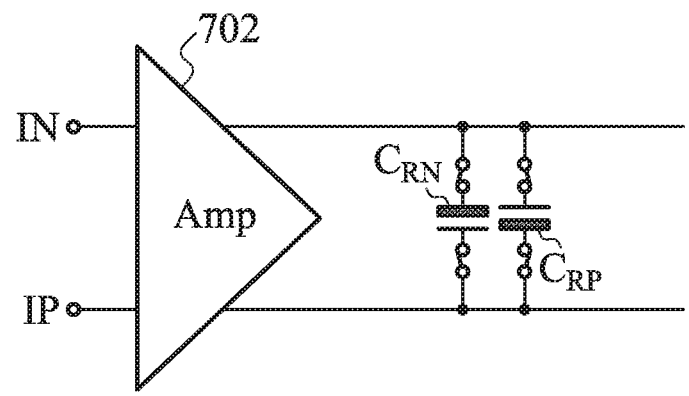
FIG. 7 depicts another residue sampling design in accordance with an exemplary embodiment of the present invention, wherein an amplifier 702 is introduced to amplify the residue voltage between the two terminals IP and IN of the CDAC 102.

FIG. 7 depicts another residue sampling design in accordance with an exemplary embodiment of the present invention. An amplifier 702 is introduced to amplify the residue voltage between the two terminals IP and IN of the CDAC 102.

Figure 8:
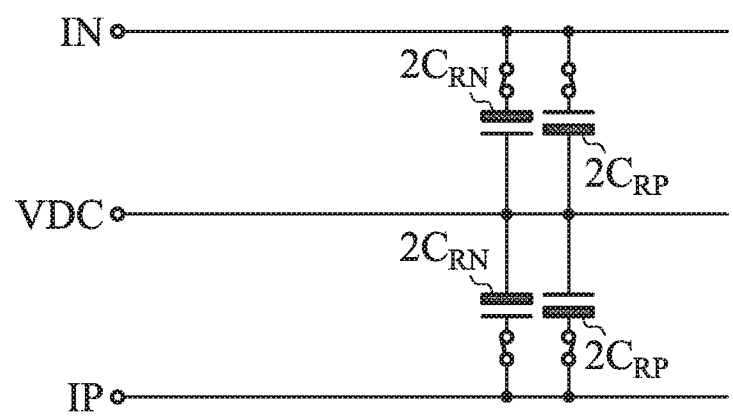
FIG. 8 depicts another residue sampling design in accordance with an exemplary embodiment of the present invention, wherein the residue sampling is further controlled by a DC voltage VDC.

FIG. 8 depicts another residue sampling design in accordance with an exemplary embodiment of the present invention. The residue sampling is further controlled by a direct current voltage VDC. As shown, each residue capacitor includes two capacitors (two residue capacitors $2C_{RP}$/two capacitors $2C_{RN}$) connected in series with a connection terminal coupled to a direct current voltage VDC.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, comprising:
a digital-to-analog converter and a comparator, wherein output terminals of the digital-to-analog converter are coupled to the comparator, and the digital-to-analog converter samples an input voltage that is an input signal of the analog-to-digital converter, and then is controlled by digital bits which are generated based on comparison performed by the comparator and, according to the digital bits, the digital-to-analog converter is operated to perform successive approximation based on the sampled input voltage and digital representation of the input voltage is generated; and
a residue sampling and integration circuit, coupled between the digital-to-analog converter and the comparator, for sampling a residue voltage generated by the digital-to-analog converter and charge-sharing of the sampled residue voltage,
wherein:
the residue sampling and integration circuit comprises a first integral capacitor coupled between a first input terminal of the comparator and a first output terminal of the digital-to-analog converter, and a first residue capacitor; and
after the first residue capacitor samples the residue voltage generated by the digital-to-analog converter, the first residue capacitor is coupled to the first integral capacitor for charge-sharing of the residue voltage.

2. The analog-to-digital converter as claimed in claim 1, wherein the residue sampling and integration circuit further comprises:
a second integral capacitor, coupled between a second input terminal of the comparator and a second output terminal of the digital-to-analog converter; and
a second residue capacitor,
wherein after the second residue capacitor samples a value of the residue voltage, the second residue capacitor is coupled to the second integral capacitor for charge-sharing of the residue voltage.

3. The analog-to-digital converter as claimed in claim 2, wherein:
when sampling the residue voltage, a top plate of the first residue capacitor is coupled to the first output terminal of the digital-to-analog converter and a bottom plate of the first residue capacitor is coupled to the second output terminal of the digital-to-analog converter; and
when sampling the value of the residue voltage, a top plate of the second residue capacitor is coupled to the second output terminal of the digital-to-analog converter and a bottom plate of the second residue capacitor is coupled to the first output terminal of the digital-to-analog converter.

4. The analog-to-digital converter as claimed in claim 3, wherein:
a top plate of the first integral capacitor is coupled to the first input terminal of the comparator and a bottom plate of the first integral capacitor is coupled to the first output terminal of the digital-to-analog converter; and
a top plate of the second integral capacitor is coupled to the second input terminal of the comparator and a bottom plate of the second integral capacitor is coupled to the second output terminal of the digital-to-analog converter.

5. The analog-to-digital converter as claimed in claim 4, wherein:
when the first residue capacitor is coupled to the first integral capacitor for charge-sharing of the residue voltage, the top plate of the first residue capacitor is coupled to the top plate of the first integral capacitor and the bottom plate of the first residue capacitor is coupled to the bottom plate of the first integral capacitor; and
when the second residue capacitor is coupled to the second integral capacitor for charge-sharing of the residue voltage, the top plate of the second residue capacitor is coupled to the top plate of the second integral capacitor and the bottom plate of the second residue capacitor is coupled to the bottom plate of the second integral capacitor.

6. The analog-to-digital converter as claimed in claim 5, wherein:
during a first input sampling phase, the digital-to-analog converter samples the input voltage;
during a first analog-to-digital conversion phase, the successive approximation is performed;
during a first residue sampling phase, the first residue capacitor samples the residue voltage and the second residue capacitor samples the value of the residue voltage; and
the first residue sampling phase overlaps the first input sampling phase and the first analog-to-digital conversion phase without using additional timing slots.

7. The analog-to-digital converter as claimed in claim 6, wherein:
during a second input sampling phase following the first analog-to-digital conversion phase, the digital-to-analog converter samples the input voltage again;

during a second analog-to-digital conversion phase following the second input sampling phase, the successive approximation is performed again;

during a first residue integral phase, the first residue capacitor is coupled to the first integral capacitor and the second residue capacitor is coupled to the second integral capacitor for charge-sharing of the residue voltage; and the first residue integral phase overlaps the second input sampling phase and the second analog-to-digital conversion phase without using additional timing slots.

8. The analog-to-digital converter as claimed in claim 7, wherein the residue sampling and integration circuit further comprises:

a third residue capacitor; and a fourth residue capacitor, wherein:

when the first residue capacitor finishes sampling the residue voltage and the second residue capacitor finishes sampling the value of the residue voltage, the third residue capacitor is switched to sample the residue voltage and the fourth residue capacitor is switched to sample the value of the residue voltage;

when the first residue capacitor is switched back to sample the residue voltage, a top plate of the third residue capacitor is coupled to the first input terminal of the comparator and a bottom plate of the third residue capacitor is coupled to the first output terminal of the digital-to-analog converter; and when the second residue capacitor is switched back to sample the value of the residue voltage, a top plate of the fourth residue capacitor is coupled to the second input terminal of the comparator and a bottom plate of the fourth residue capacitor is coupled to the second output terminal of the digital-to-analog converter.

9. The analog-to-digital converter as claimed in claim 8, wherein:

when using the third residue capacitor to sample the residue voltage, the top plate of the third residue capacitor is coupled to the first output terminal of the digital-to-analog converter and the bottom plate of the third residue capacitor is coupled to the second output terminal of the digital-to-analog converter; and when using the fourth residue capacitor to sample the value of the residue voltage, the top plate of the fourth residue capacitor is coupled to the second output terminal of the digital-to-analog converter and the bottom plate of the fourth residue capacitor is coupled to the first output terminal of the digital-to-analog converter.

10. The analog-to-digital converter as claimed in claim 9, wherein:

during a second residue sampling phase, the third residue capacitor samples the residue voltage and the fourth residue capacitor samples the value of the residue voltage; and the second residue sampling phase overlaps the second input sampling phase and the second analog-to-digital conversion phase without using additional timing slots.

11. The analog-to-digital converter as claimed in claim 10, wherein:

the digital-to-analog converter samples the input voltage according to a first control signal; and the first control signal is asserted during the first input sampling phase and the second input sampling phase.

12. The analog-to-digital converter as claimed in claim 11, wherein:

the comparator compares signals at the first and second input terminals when a second control signal is asserted;

the second control signal oscillates between high and low during the first analog-to-digital conversion phase; and the second control signal oscillates between high and low during the second analog-to-digital conversion phase.

13. The analog-to-digital converter as claimed in claim 12, wherein:

the first residue sampling phase starts by asserting a third control signal and finishes by de-asserting the third control signal; and the third control signal is asserted after a first assertion of the first control signal and prior to oscillation of the second control signal, and is de-asserted before a second assertion of the first control signal.

14. The analog-to-digital converter as claimed in claim 13, wherein:

the second residue sampling phase starts by asserting a fourth control signal and finishes by de-asserting the fourth control signal; and the fourth control signal is asserted after the second assertion of the first control signal and prior to oscillation of the second control signal, and is de-asserted before a third assertion of the first control signal.

15. The analog-to-digital converter as claimed in claim 9, wherein:

the first input terminal and the second input terminal of the comparator form an input pair of the comparator;

the first input terminal is a positive input terminal; and the second input terminal is a negative input terminal.

16. The analog-to-digital converter as claimed in claim 1, further comprising:

a successive approximation logic unit, coupled to an output terminal of the comparator to generate the digital bits controlling the digital-to-analog converter according to the comparator; and a decoder, decoding according to the successive approximation logic unit to generate the digital representation of the input voltage.

17. The analog-to-digital converter as claimed in claim 1, wherein:

the digital-to-analog converter operates at a stable common-mode voltage.

18. The analog-to-digital converter as claimed in claim 1, wherein:

the digital-to-analog converter operates at a changing common-mode voltage for single-side successive approximation.

19. The analog-to-digital converter as claimed in claim 2, further comprising:

an amplifier, having input terminals coupled to the first output terminal and the second output terminal of the digital-to-analog converter, and having output terminals coupled to the first integral capacitor and the second integral capacitor.

20. The analog-to-digital converter as claimed in claim 2, wherein:

the first residue capacitor is formed by two capacitors connected in series with a connection terminal coupled to a direct current voltage; and the second residue capacitor is formed by two capacitors connected in series with a connection terminal coupled to the direct current voltage.

* * * * *